United States Patent [19]
Park

[11] Patent Number: 5,970,377
[45] Date of Patent: Oct. 19, 1999

[54] METHOD OF FORMING A METAL INTERCONNECTION LINE FOR SEMICONDUCTOR DEVICE

[75] Inventor: Sang-Hoon Park, Kyoungki-do, Rep. of Korea

[73] Assignee: Hyundai Electronics Industries Co., Ltd., Kyoungki-do, Rep. of Korea

[21] Appl. No.: 08/911,872

[22] Filed: Aug. 15, 1997

[30] Foreign Application Priority Data

Dec. 27, 1996 [KR] Rep. of Korea ................. 96-72820

[51] Int. Cl.⁶ ................................................. H01L 21/283
[52] U.S. Cl. ........................ 438/643; 438/648; 438/672; 438/688
[58] Field of Search ........................... 438/618, 688, 438/643, 644, 648, 672, 351, 359, 629, FOR 351, FOR 359; 257/765

[56] References Cited

U.S. PATENT DOCUMENTS

| | | | |
|---|---|---|---|
| 5,395,795 | 3/1995 | Hong et al. | 437/190 |
| 5,521,119 | 5/1996 | Chen et al. | 437/187 |
| 5,552,340 | 9/1996 | Lee et al. | 437/190 |
| 5,658,828 | 8/1997 | Lin et al. | 438/643 |
| 5,693,562 | 12/1997 | Tseng | 437/190 |
| 5,723,362 | 3/1998 | Inoue et al. | 437/190 |
| 5,844,318 | 12/1998 | Sandhu et al. | 257/774 |
| 5,899,738 | 5/1999 | Wu et al. | 438/618 |
| 5,904,561 | 5/1999 | Tseng | 438/643 |

FOREIGN PATENT DOCUMENTS

| | | | |
|---|---|---|---|
| 2-031445 | 2/1990 | Japan | 21/90 |
| 9-162281 | 6/1997 | Japan | 21/768 |

OTHER PUBLICATIONS

Sobue, et al., "Dependence of Diffusion Barrier Properties in Microstructure of Reactively Sputtered TiN Films in Al Alloy/TiN/Ti/Si System", Applied Surface Science, vol. 117–118, pp. 308–311,Jun. 1997.

Sandhu, "process Technology and Intergration Challenges for High Performance Interconnects", Thin Solid Films, vol. 320, Issue: 1, pp. 1–9 May 4, 1998.

*Primary Examiner*—George Fourson
*Assistant Examiner*—Glen Whichard
*Attorney, Agent, or Firm*—Ware, Fressola, Van Der Sluys & Adolphoson LLP

[57] ABSTRACT

Disclosed is a method of forming a metal interconnection line for a semiconductor device. A metal interconnection line for semiconductor device according to the present invention is formed by the following processes. A semiconductor substrate having a conductive layer thereon is provided and an insulating layer is formed on the semiconductor substrate. A contact hole is formed by etching a selected portion of the insulating layer existing on the conductive layer to expose a predetermined portion of the conductive layer. A barrier metal film is then formed on a surface of the contact hole and the insulating film. A first aluminum alloy film is uniformly formed on the barrier metal film and a metal film for use as a plug is formed on the first aluminum alloy film filling the contact hole wherein the contact hole is covered with the first aluminum alloy film. A contact plug is then formed by etching back the metal film to expose the first aluminum alloy film. A second aluminum alloy film is formed on the contact plug and the first aluminum alloy film.

12 Claims, 4 Drawing Sheets

METHOD OF FORMING A METAL INTERCONNECTION LINE FOR SEMICONDUCTOR DEVICE

BACKGROUND OF THE INVENTION

1. Field of the Invention

The present invention relates to a method of fabricating a semiconductor device, and more particularly to a method of forming a metal interconnection line for a semiconductor device by using a contact plug.

2. Description of the Related Art

Generally, with high integration of semiconductor devices, pitch between metal interconnection lines and area of a contact hole are decreased, and aspect ratio is increased. In the case of metal interconnection line formed by using the sputtering technique, the strength of a coating for the metal wiring can become weakened. Accordingly, the metal interconnection line can short-circuit. In addition, as the depth of a diffusion region becomes shallower, a contact resistance of the metal interconnection line is increased. In order to solve these problems, the failure of the metal interconnection line is prevented and the contact resistance is reduced by forming a contact plug according to the prior art.

FIG. 1 is a sectional view of a conventional semiconductor device, showing a metal interconnection line structure employing a contact plug.

As shown in FIG. 1, an insulating layer 3 is formed on a semiconductor substrate 1 having an impurity region 2 formed therein. A portion of the insulating layer 3 is then etched to form a contact hole. Afterwards, a Ti/TiN film 4 acting as a barrier metal film is formed on upper surface and sides of the contact hole and on the insulating film 3. A contact plug 5 is formed within the contact hole with the Ti/TiN film 4. An aluminum alloy film 6 is formed on the Ti/TiN film 4 and the contact plug 5, and thus, the formation of the metal wiring is completed.

In the formation of the above metal interconnection line, the contact plug 5 is formed by depositing a tungsten(W) film on the Ti/TiN film 4 in order to fill the contact hole and by etching-back the tungsten film in order to expose the Ti/TiN film 4. At this time, in order to minimize the loss of the Ti/TiN film 4 which is positioned below the tungsten film at the time that the wolfram film is etched, end pointing etching is performed. Thereafter, an over etching is performed in order to completely remove the wolfram film remaining on the upper surface of the Ti/TiN film 4. If the over etching is not performed, the metal interconnection line is bridged by the remaining tungsten film. When the over etching is performed, however, a shallow groove is formed in the center of the upper surface of the contact plug 5 due to a high etching ratio of the tungsten film and the Ti/TiN film 4, and as a result, the metal interconnection line can short-circuit. When the metal interconnection line is formed within the contact hole by using the Ti/TiN film 4 and the tungsten film, the resistance of the metal interconnection line in the contact hole is increased because the resistance of the tungsten is greater than that of the aluminum. That is, the resistance of the wolfram is about 6 to $15\mu\Omega\cdot cm$, and the resistance of the aluminum is about 2.7 to $3.0\mu\Omega\cdot cm$. Accordingly, the resistance of the metal interconnection line is increased 2 to 10 times.

SUMMARY OF THE INVENTION

The present invention is provided to solve the foregoing problems. It is an object of the present invention to provide a method of forming a metal interconnection line for a semiconductor device capable of enhancing the filling property of a metal in a contact hole under a state where a sufficient over etching is performed during the formation of a contact plug.

In addition, it is another object of the present invention to provide a method of forming a metal interconnection line for a semiconductor device capable of reducing the electrical resistance of an interconnection line in a contact hole.

To achieve the above objects, a metal interconnection line for semiconductor device according to the present invention is formed by the following processes. A semiconductor substrate having a conductive layer thereon is provided and an insulating layer is formed on the semiconductor substrate. A contact hole is formed by etching a selected portion of the insulating layer existing on the conductive layer to expose a predetermined portion of the conductive layer. A barrier metal film is then formed on a surface of the contact hole and the insulating film. A first aluminum alloy film is uniformly formed on the barrier metal film and a metal film for use as a plug is formed on the first aluminum alloy film filling the contact hole wherein the contact hole is covered with the first aluminum alloy film. A contact plug is then formed by etching back the metal film to expose the first aluminum alloy film. A second aluminum alloy film is formed on the contact plug and the first aluminum alloy film.

BRIEF DESCRIPTION OF THE DRAWINGS

The above object and other characteristics and advantages of the present invention will become more apparent by describing in detail a preferred embodiment thereof with reference to the attached drawings, in which.

DETAILED DESCRIPTION OF THE INVENTION

Hereinafter, the preferred embodiment of the present invention will be explained in more detail with reference to the accompanying drawings.

Figure 1:
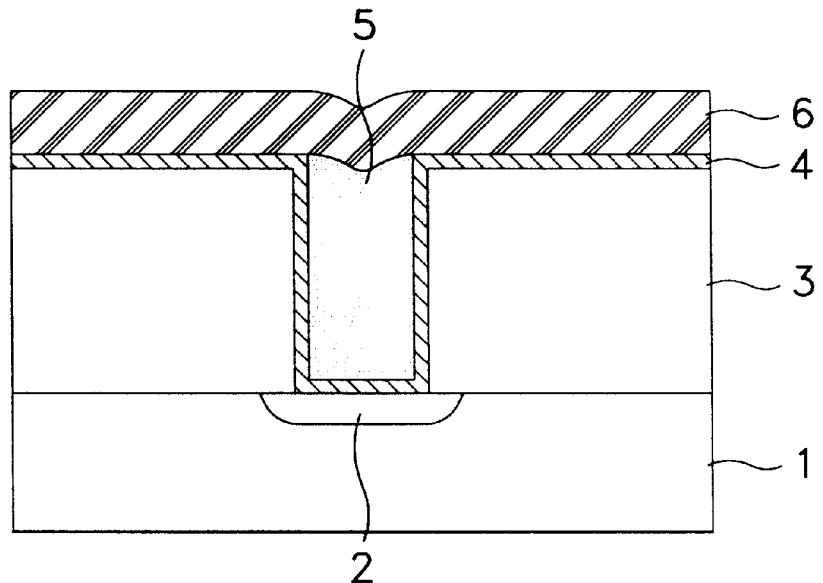
FIG. 1 is a sectional view of a conventional semiconductor device, showing a metal interconnection line structure employing a contact plug.
Figure 2A:
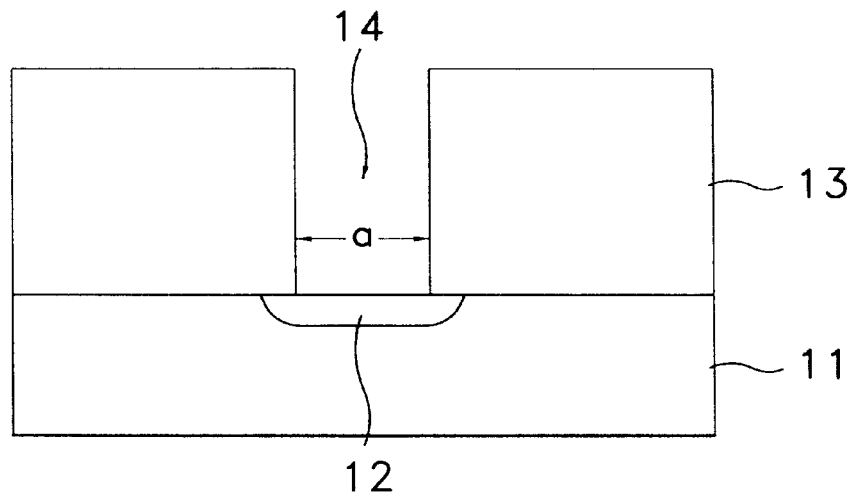
FIGS. 2A to 2F are schematic sectional views of a semiconductor device according to a preferred embodiment of the present invention, showing a method for forming a metal interconnection line for the semiconductor device.

As shown in FIG. 2A, an oxidation layer 13 is formed on a semiconductor substrate 11 in which an impurity region 12 is formed. A predetermined mask pattern (not shown) is then formed on the oxidation layer 13 by a photolithography. Thereafter, a portion of the oxidation layer 13 is exposed by performing an anisotropic etching employing the mask pattern. As a result, a contact hole 14 is formed. Then, the mask pattern is removed by using a well-known method.

Figure 2B:
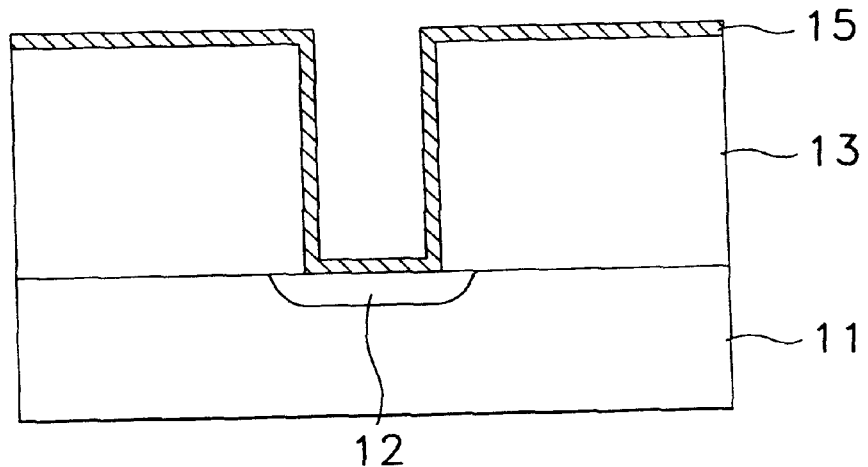

As shown in FIG. 2B, a Ti/TiN film 15 consisting of a Ti film and a TiN film is formed as a barrier film on a surface of the contact hole 14 and the oxidation layer 13. At this time, the Ti film has a thickness of about 200 to 400 Å, and the TiN film has a thickness of about 600 to 900 Å.

Figure 2C:
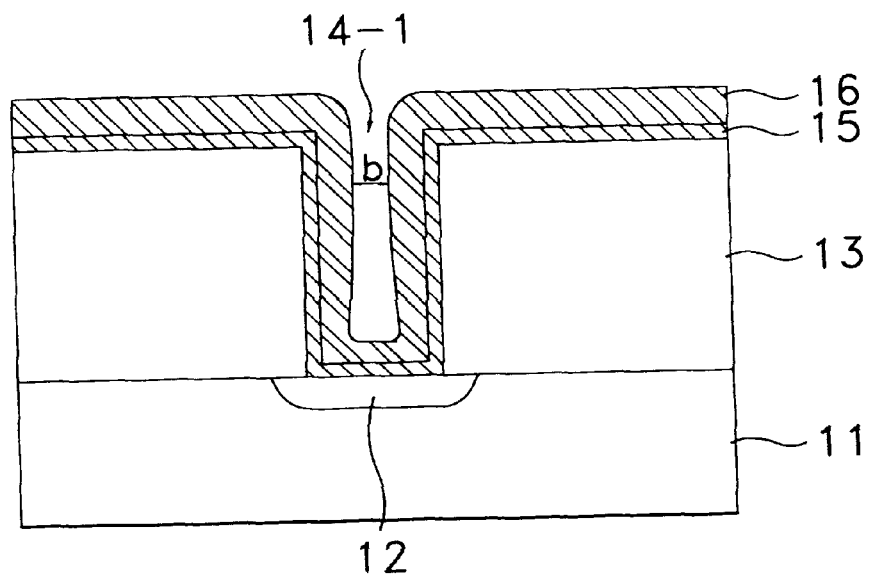

As shown in FIG. 2C, a low-temperature aluminum alloy film 16 having a thickness of about 1,000 to 2,000 Å is uniformly formed on the Ti/TiN film 15. At this time, a forming temperature of the low-temperature aluminum alloy film 16 is about 50 to 250° C. and the composition of the low-temperature aluminum alloy is Al+1%Si+0.5%Cu. The size of the contact hole 14 filled with a plug metal decrease from "a" to "b" by the low-temperature aluminum alloy. At this time, the size "a" is the same as the sum of the size "b" and twice the thickness of the low-temperature aluminum alloy film 16 and the Ti/TiN film 15. Thereafter, a predetermined native oxidation film (not shown), which is formed on the surface of the low-temperature aluminum alloy film 16, is removed by using a $NF_3$ plasma.

Figure 2D:
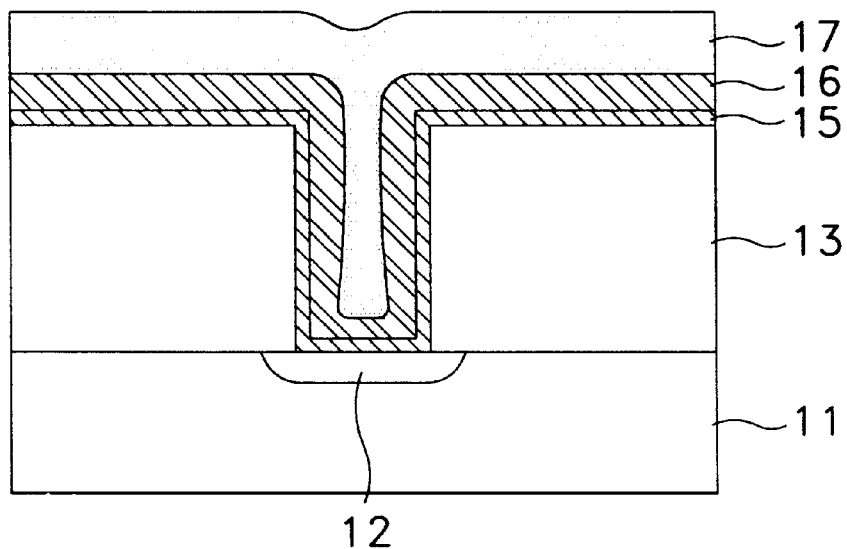

As shown in FIG. 2D, a tungsten film 17 is formed on the low-temperature aluminum alloy film 16 as a plug metal film so that a contact hole 14–1 with the low-temperature aluminum film 16 existing thereon is filled with the tungsten film 17. At this time, the tungsten film 17 is formed by using $WF_3$ gas and $SiH_4$ gas, and to a thickness of about 5,000 to 7,000 Å.

Figure 2E:
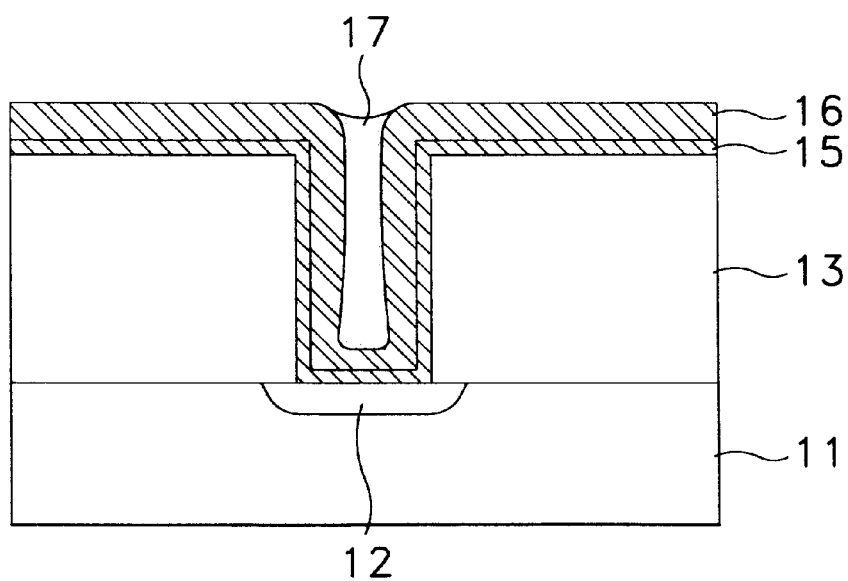

As shown in FIG. 2E, the tungsten film 17 is then etched by etching back using $SF_3$ gas so that the low-temperature aluminum alloy film 16 is exposed. At this time, although an over etching is performed, a shallow groove is not formed in the tungsten film 17, as in the case of the conventional art. Thereafter, impurities (not shown) remaining on upper portions of the low-temperature aluminum alloy film 16 and the tungsten film 17 are removed by using a sputter etching method employing Ar gas.

Figure 2F:
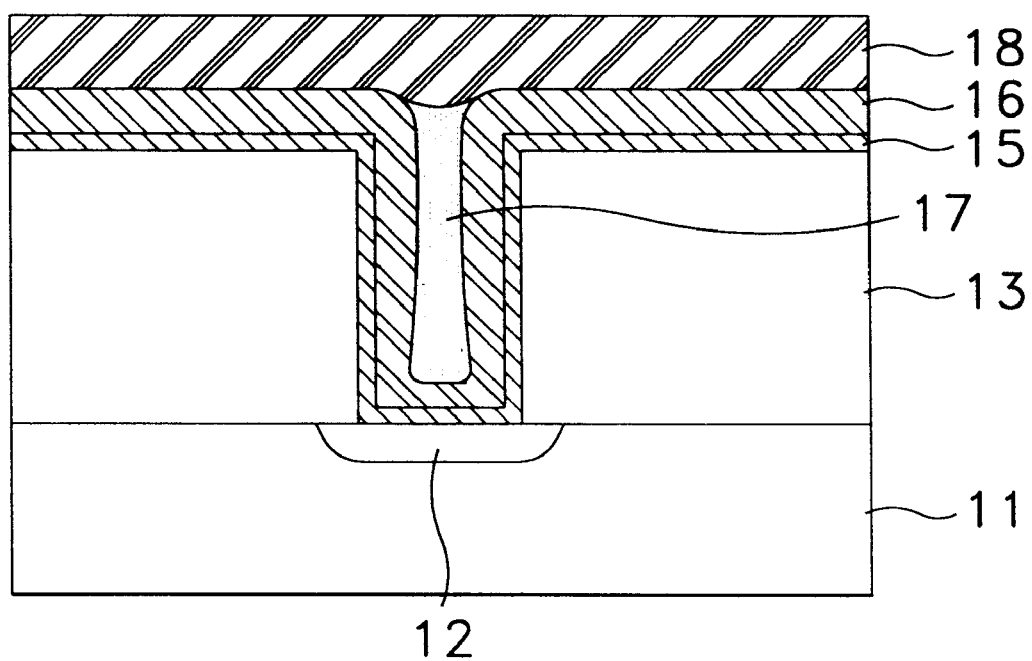

As shown in FIG. 2F, a high-temperature aluminum alloy film 18 having a thickness of about 4,000 to 8,000 Å is formed on the structure of FIG. 2E. At this time, the forming temperature of the high-temperature aluminum alloy film 18 is about 400 to 550° C., and the composition thereof is Al+1%Si+0.5%Cu. A surface of the semiconductor device is planar in the formation of the high-temperature aluminum alloy film 18.

As described above, according to the preferred embodiment of the present invention, the size of the contact plug is reduced with the formation of the low-temperature aluminum alloy film. Accordingly, although the over etching during the formation of the contact plug is sufficient performed, a shallow groove is not formed on the contact plug. Consequently, the characteristics of the metal interconnection line are enhanced. In addition, as the Ti/TiN film, the low-temperature aluminum alloy film and the tungsten film are formed in sequence, the resistance of the interconnection line decreases. Further, it is possible to obtain the interconnection having a planar surface by employing the high-temperature aluminum alloy film. The reliability of the semiconductor device is thus enhanced.

While the present invention has been particularly shown and described with reference to a particular embodiment thereof, it will be understood by those skilled in the art that various changes in form and detail may be effected therein without departing from the spirit and scope of the invention as defined by the appended claims.

What is claimed is:

1. A method of forming a metal interconnection line for a semiconductor device, comprising the steps of:

(S1) providing a semiconductor substrate having a conductive layer thereon;.

(S2) forming an insulating layer on the semiconductor substrate;

(S3) forming a contact hole by etching a selected portion of the insulating layer existing on the conductive layer to expose a portion of the conductive layer;

(S4) forming a barrier metal film on a surface of the contact hole and the insulating film;

(S5) uniformly forming a first aluminum alloy film on the barrier metal film;

(S6) forming a metal film on the first aluminum alloy film for filling the contact hole wherein the contact hole is covered with the first aluminum alloy film;

(S7) forming a contact plug by etching back the metal film on the first aluminum alloy film in order to expose the first aluminum alloy film; and (S8) forming a second aluminum alloy film on the contact plug and the first aluminum alloy film.

2. The method of forming a metal interconnection line for a semiconductor device as claimed in claim 1, wherein the first aluminum alloy film comprises a low-temperature aluminum alloy film formed at a temperature of 50 to 250° C.

3. The method of forming a metal interconnection line for a semiconductor device as claimed in claim 2, wherein the low-temperature aluminum alloy film has a thickness of 1,000 to 2,000 Å.

4. The method of forming a metal interconnection line for a semiconductor device as claimed in claim 1, wherein the second aluminum alloy film comprises a high-temperature aluminum alloy film formed at a temperature of 400 to 550° C.

5. The method of forming a metal interconnection line for a semiconductor device as claimed in claim 1, wherein the metal film on the first aluminum alloy film comprises a tungsten film.

6. The method of forming a metal interconnection line for a semiconductor device as claimed in claim 1, wherein the etching back is performed by an over etching.

7. The method of forming a metal interconnection line for a semiconductor device as claimed in claim 1, wherein the etching back is performed by using $SF_6$ gas in the step (S7) for forming the contact plug.

8. The method of forming a metal interconnection line for a semiconductor device as claimed in claim 1, wherein the barrier metal film comprises a stacked Ti film and TiN film.

9. The method of forming a metal interconnection line for a semiconductor device as claimed in claim 1, further comprising removing a native oxidation film formed on a surface of the first aluminum alloy film after forming the first aluminum alloy film.

10. The method of forming a metal interconnection line for a semiconductor device as claimed in claim 9, wherein the native oxidation film is removed by using $NF_3$ plasma.

11. The method of forming a metal interconnection line for a semiconductor device as claimed in claim 1, further comprising removing impurities remaining on upper portions of the first aluminum alloy film and the metal film after etching back the metal film on the first aluminum alloy film.

12. The method of forming a metal interconnection line for a semiconductor device as claimed in claim 11, wherein the impurities are removed by using a sputter etching method employing Ar gas.

* * * * *

UNITED STATES PATENT AND TRADEMARK OFFICE
CERTIFICATE OF CORRECTION

PATENT NO : 5,970,377
DATED : October 19, 1999
INVENTOR(S): S. Park

It is certified that error appears in the above-identified patent and that said Letters Patent are hereby corrected as shown below:

At col. 2, line 51, insert --using-- after "layer 13 by".

At col. 3, line 57, cancel the period after "thereon;".

Signed and Sealed this

Third Day of April, 2001

Attest:

NICHOLAS P. GODICI

Attesting Officer

Acting Director of the United States Patent and Trademark Office